(12) United States Patent
Krishnamurthy et al.

(10) Patent No.: US 9,385,698 B2
(45) Date of Patent: Jul. 5, 2016

(54) PULSE WIDTH MODULATOR FOR HIGH SPEED DIGITALLY CONTROLLED VOLTAGE REGULATOR

(71) Applicants: Harish K. Krishnamurthy, Beaverton, OR (US); George E. Matthew, Hillsboro, OR (US); Bharani Thiruvengadam, Beaverton, OR (US)

(72) Inventors: Harish K. Krishnamurthy, Beaverton, OR (US); George E. Matthew, Hillsboro, OR (US); Bharani Thiruvengadam, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 377 days.

(21) Appl. No.: 14/129,276

(22) PCT Filed: Jun. 28, 2013

(86) PCT No.: PCT/US2013/048536
§ 371 (c)(1),
(2) Date: Dec. 24, 2013

(87) PCT Pub. No.: WO2014/209353
PCT Pub. Date: Dec. 31, 2014

(65) Prior Publication Data
US 2016/0118967 A1  Apr. 28, 2016

(51) Int. Cl.
*H03L 7/06* (2006.01)
*H03K 5/13* (2014.01)
*H03K 7/08* (2006.01)
*H03L 7/081* (2006.01)
*H02M 3/158* (2006.01)
*G06F 1/32* (2006.01)
*H03K 5/00* (2006.01)

(52) U.S. Cl.
CPC *H03K 5/13* (2013.01); *G06F 1/324* (2013.01);
*G06F 1/3265* (2013.01); *H02M 3/158* (2013.01); *H03K 7/08* (2013.01); *H03L 7/0818* (2013.01); *H03K 2005/00019* (2013.01)

(58) Field of Classification Search
USPC .................................. 327/147–149, 156–158
See application file for complete search history.

(56) References Cited

U.S. PATENT DOCUMENTS 7,333,390 B2 * 2/2008 D'Luna ............... G06F 13/4243
                                                                  327/156
7,486,145 B2 * 2/2009 Floyd ..................... H03L 7/1974
                                                                  327/115
2005/0046478 A1 * 3/2005 Ohara ...................... H03F 1/26
                                                                  330/251

(Continued)

FOREIGN PATENT DOCUMENTS

RU      2168268 C1    5/2001

OTHER PUBLICATIONS

Notification of Transmittal of the International Search Report and Written Opinion of the International Searching Authority issued for PCT International Application No. PCT/US2013/048536, mailed Mar. 20, 2014, 7 pages.

*Primary Examiner* — Adam Houston
(74) *Attorney, Agent, or Firm* — Blakely, Sokoloff, Taylor & Zafman LLP (57) ABSTRACT

Described is a pulse width modulation architecture for high speed digitally controlled voltage regulator. Described is an apparatus which comprises: a first phase interpolator (PI) for coupling an input to a delay element of a delay line, wherein the coupling is via a selection unit; a second PI for coupling an output of the delay element of the delay line, wherein the coupling is via the selection unit; and a third PI for providing an output, the third PI calibrated according to delay settings of the first and second PIs.

20 Claims, 5 Drawing Sheets

(56) References Cited

U.S. PATENT DOCUMENTS

| | | | |
|---|---|---|---|
| 2008/0197830 A1* | 8/2008 | Mehas | H03L 7/085 323/318 |
| 2009/0289672 A1* | 11/2009 | Hua | H03L 7/07 327/147 |
| 2011/0141780 A1 | 6/2011 | O'Malley et al. | |
| 2012/0154005 A1 | 6/2012 | Frederiksen et al. | |
| 2014/0086364 A1* | 3/2014 | Schell | H03H 7/06 375/340 |
| 2014/0139266 A1* | 5/2014 | Kenney | G01R 25/005 327/9 |

* cited by examiner

PULSE WIDTH MODULATOR FOR HIGH SPEED DIGITALLY CONTROLLED VOLTAGE REGULATOR

CLAIM OF PRIORITY

This application claims the benefit of priority of International Patent Application No. PCT/US2013/048536 filed Jun. 28, 2013, titled "PULSE WIDTH MODULATOR FOR HIGH SPEED DIGITALLY CONTROLLED VOLTAGE REGULATOR," which is incorporated by reference in its entirety.

BACKGROUND

Digital control implementations for voltage regulators have a digital PWM (pulse width modulator) that generates a duty cycle pulse from an input digital word. Traditionally this DPWM (digital pulse width modulator) involves a delay line and a counter to achieve the best compromise for area and power. It also involves some asynchronous logic to create the PWM (pulse width modulation) pulse and the presence of asynchronous logic would mean a lot more verification and validation to ensure that the PWM pulses are monotonic and uniformly varying with the input digital word. However, traditional schemes are not catered to extend to high frequency applications (e.g., 100 MHz or higher) where the resolutions for the time quantization are less than a single buffer of a given process node.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe a high frequency (e.g., frequencies greater or equal to 100 MHz) digitally controlled architecture with high pulse width modulation resolution (e.g., 1 ps). The embodiments use a combination of delay locked loop (DLL), counter, and phase interpolators (PIs) to achieve high resolution for fine control of voltage regulation.

The resolution of a DPWM, i.e., the smallest change it can make to the on-time of the bridge transistors, determines the smallest step in output voltage that can be controlled. For example, to control the output voltage Vout of the voltage regulator in steps of 5 mV ($\Delta$Vout) for a 1.8V input voltage (Vin) at a switching frequency of 500 MHz (i.e., 1/Tsw), the time resolution of the DPWM is calculated to be:

$$\Delta t = \frac{\Delta Vout * Tsw}{Vin} = \frac{5 \text{ mV} * 2 \text{ ns}}{1.8 \text{ V}} = 5.5 \text{ ps}$$

Achieving 5.5 ps of granularity of PWM duty cycle control to adjust Vout by steps of 5 mV is not achievable with traditional analog or digital PWMs. The embodiments can achieve finer granularity of PWM duty cycle control for finer adjustments of Vout (i.e., output of voltage regulator which depends on PWM duty cycle). The embodiments can be used for any voltage regulator (e.g., buck, boost, and other switching regulators) using PWW signals. The embodiments are not limited to voltage regulators, but can be used for any circuit using PWM signals.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
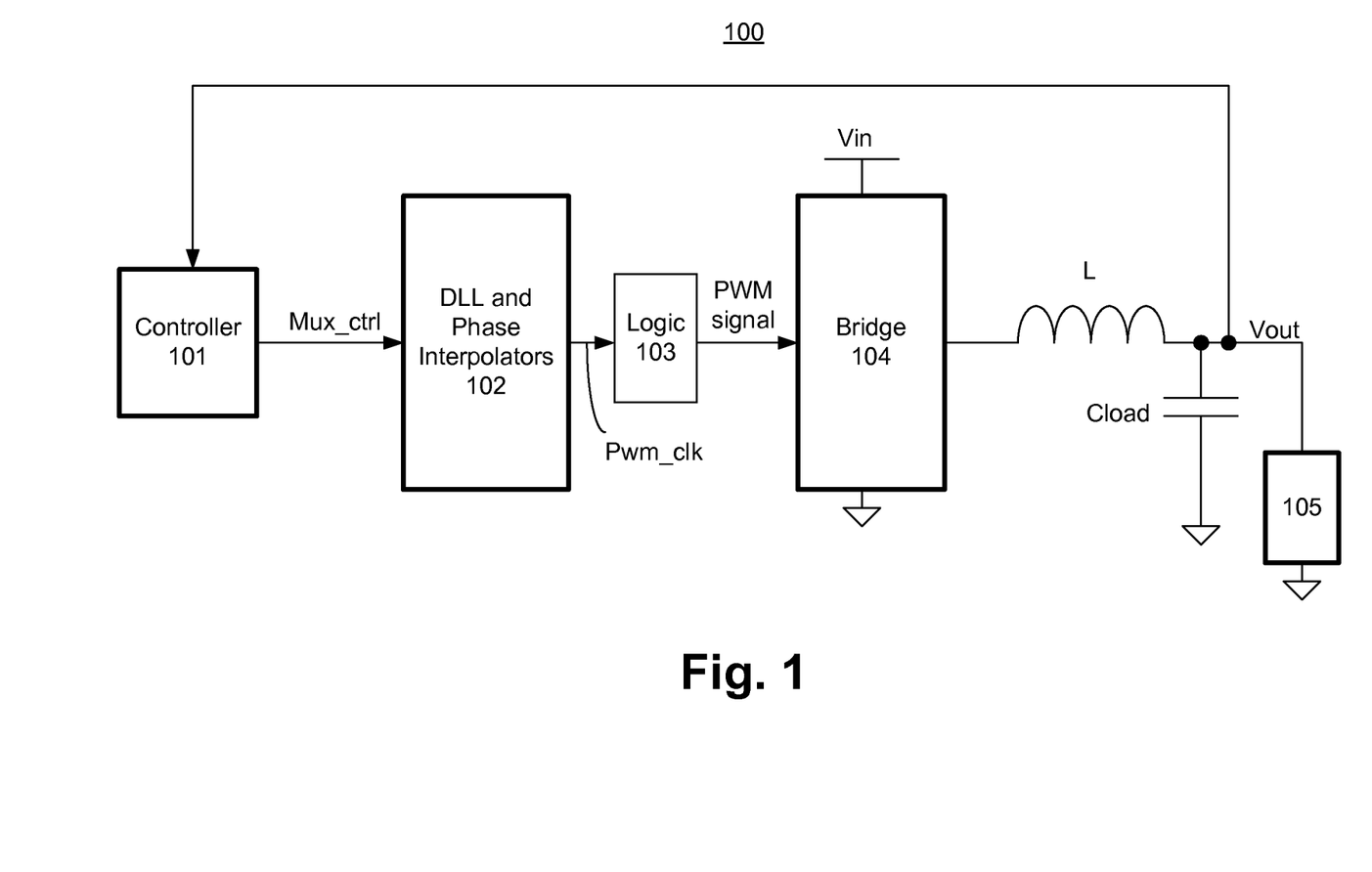
FIG. 1 is a voltage regulator with digitally controlled pulse width modulation (PWM) signal, according to one embodiment of the disclosure.

FIG. 1 is a voltage regulator (VR) 100 with digitally controlled PWM signal, according to one embodiment of the disclosure. In one embodiment, VR 100 comprises a digital controller 101, DLL coupled with PIs 102, logic 103, bridge 104, inductor L, load capacitor Cload coupled to load 105.

In one embodiment, controller 101 monitors output voltage Vout and causes adjustment to duty cycle of PWM signal via multiplexer control (Mux_ctlr) signal. In one embodiment, Mux_ctlr is received by a multiplexer coupled to a delay line of the DLL in block 102. In such an embodiment, the multiplexer selects a tap from the delay line (which is delay locked using a reference clock signal). In one embodiment, the selected tap from the delay line is the coarse delay signal which is then used by a PI in 102 to add a fine delay to the coarse delay signal. In one embodiment, the output of the PI is a periodic signal PWM_clk with fine delay adjustment to at least one of its edges (e.g., rising edge). In one embodiment, this periodic signal (i.e., PWM_clk) is used by logic 103 to generate the PWM signal. In one embodiment, logic 103 includes set-reset (SR) latches (discussed with reference to FIG. 3) to generate the PWM signal.

In one embodiment, the PWM signal is received by bridge 104 which includes high-side and low-side switch drivers to drive current through inductor L to generate output voltage Vout. Bridge 104 receives unregulated input voltage Vin and generates a regulated output voltage Vout according to the duty cycle of the PWM signal. In this embodiment, Vout can be adjusted by fine steps (e.g., 5 mV) by adjusting duty cycle of the PWM signal by fine time delays (e.g., 1 ps). In one embodiment, load 105 is a processor. In other embodiments, load 105 can be any logic or functional block. In one embodiment, VR 100 is on-die within a processor. In other embodiments, VR 100 is an off-die standalone component. The embodiments are applicable for any circuit needing a PWM signal. For example, buck converters, boost converters, buck-boost converters, spread-spectrum circuits, etc.

Figure 2A:
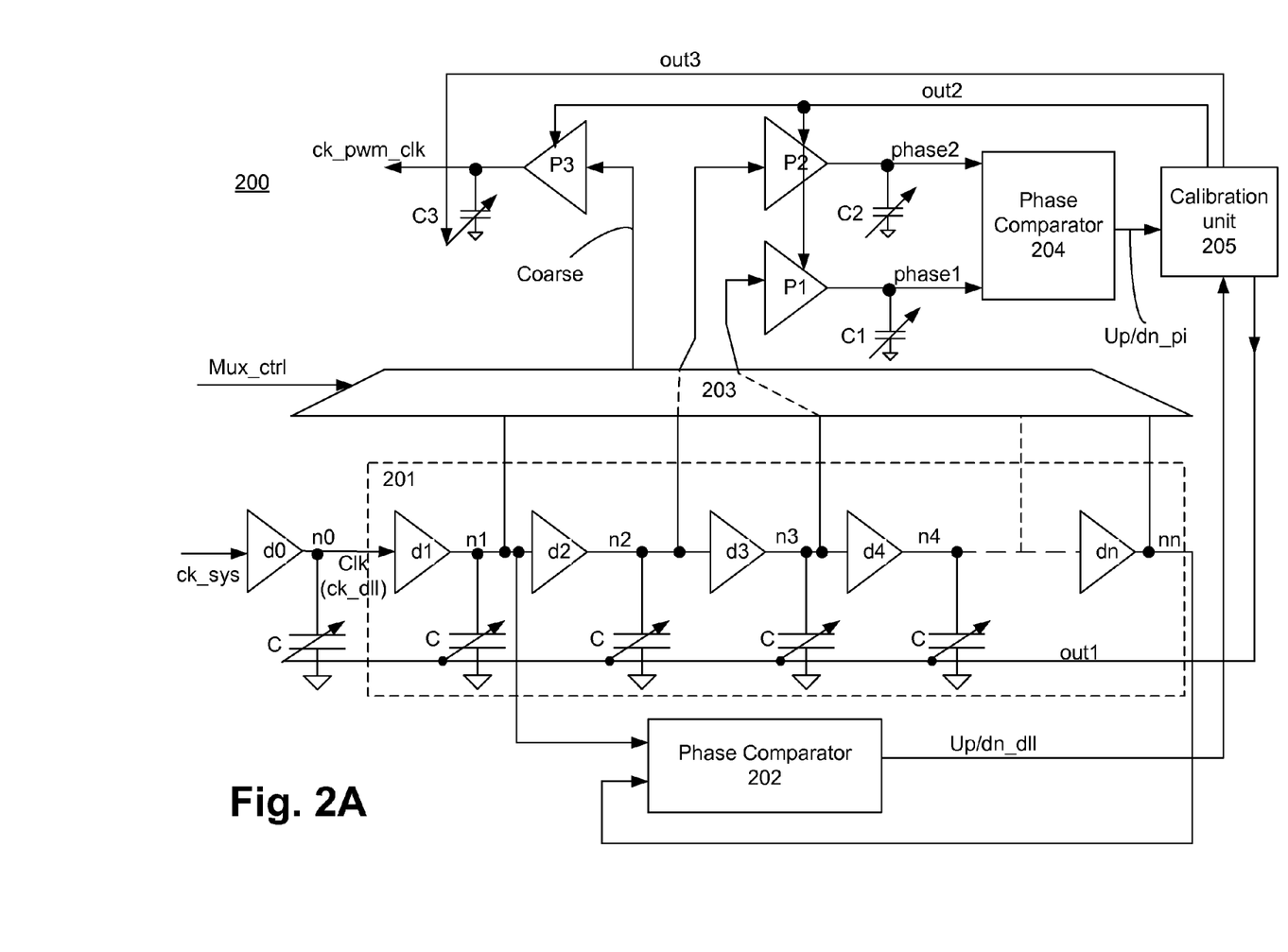
FIG. 2A is a delay locked loop (DLL) with phase interpolators (PIs) for generating digitally controlled PWM signal, according to one embodiment of the disclosure.

FIG. 2A is a circuit 200 with a DLL and PIs for generating digitally controlled pulse width modulation signal, according to one embodiment of the disclosure. It is pointed out that those elements of FIG. 2A having the same reference numbers (or names) as the elements of any other figure can operate or function in any manner similar to that described, but are not limited to such.

In one embodiment, circuit 200 comprises a delay line 201, phase comparator 202, multiplexer 203, phase interpolators (PIs) P1, P2, and P3, phase comparator 204, calibration unit 205. In one embodiment, delay line 201 comprises 'n' number of delay stages d1-dn (where 'n' is an integer greater than 1). In one embodiment, delay stage d1 receives input from a conditioning delay stage d0 i.e., it conditions slope of input signal at node n0 to be similar to slope on node n1 of delay line 201. In one embodiment, delay stage d0 receives input clock "ck_sys" and buffers it to delay stage d1 as "ck_dll" (also referred to as Clk). In one embodiment, output of delay stage d0 is loaded by an adjustable capacitance load C at node n0.

In one embodiment, the adjustable capacitance load C has the same capacitance setting as other capacitors Cs of delay line 201.

In one embodiment, output of each delay stage is coupled to an adjustable capacitive load C. For example, output node n1 of delay stage d1 is coupled to capacitor C; output node n2 of delay stage d2 is coupled to capacitor C, and so on. In one embodiment, capacitance of capacitor C is adjusted by calibration unit 205 according to output Up/dn_dll of phase comparator 202. In one embodiment, output nodes of the delay stages have the same capacitor. In one embodiment, a periodic clock signal Clk is received by the first delay stage d1 and is used for locking the delay line to a period of the clock signal Clk.

In one embodiment, phase comparator 202 is a DLL (delay locked loop) phase comparator (also called phase detector) which compares signal on node n1 (i.e., beginning of the delay line) with signal on node nn (i.e., end of the delay line). In one embodiment, output Up/dn_dll of phase comparator 202 indicates a difference in the phases of signals on nodes n1 and nn. In one embodiment, calibration unit 205 receives output Up/dn_dll of phase comparator 202 and adjusts the capacitance of capacitor C via out1 to slow down the delay line 201 or speed it up till the delay line 201 is locked to a particular delay (e.g., period of the clock signal Clk).

In one embodiment, after the delay line 201 is adjusted and locked to a particular delay, the process of generating and adjusting ck_pwm_clk begins. In one embodiment, ck_pwm_clk is used to generate the PWM signal of FIG. 1 with fine duty cycle adjustment. Referring back to FIG. 2A, in one embodiment, multiplexer 203 is operable, via Mux_ctrl signal, to tap any node on the delay line 201. In one embodiment, output of multiplexer 203 is Coarse signal which is the coarse clock and will be converted to the fine clock by the PI P3. So as not to obscure the embodiments, a single multiplexer 203 is shown. However, any number of multiplexers may be used in combination to achieve the functions discussed in various embodiments.

In one embodiment, PIs P1 and P2 receive inputs from input and output of a delay stage. In this example, signals on nodes n2 and n3 are received by PIs P2 and P1, respectively. In one embodiment, output (phase1) of P1 is coupled to capacitor C1 and output (phase2) of P2 is coupled to capacitor C2. In one embodiment, both capacitors C1 and C2 have adjustable capacitance. For example, capacitors C1 and C2 are operable to increase or decrease their capacitances monotonically using thermometer code i.e., capacitors C1 and C2 are thermometer weighted. In one embodiment, capacitors C, C1, C2, and C3 are MOS based capacitors. In one embodiment, capacitors C, C1, C2, and C3 are metal capacitors. In one embodiment, capacitors C, C1, C2, and C3 are implemented as a combination of MOS and metal capacitors. In one embodiment, outputs phase1 and phase2 are received by phase comparator 204 (also referred as a phase detector).

In one embodiment, phase comparator 204 compares signals phase1 and phase2 and generates an Up/dn_pi signal for calibration unit 205. In one embodiment, calibration unit 205 generates output out2 which is used to set propagation delays of PIs P1, P2, and P3, and/or capacitances C1, C2, and C3. In one embodiment, calibration unit 205 generates out3 signal to adjust capacitance of capacitor C3 independent of adjusting capacitances of capacitors C1 and C2. In one embodiment, PIs P1 and P2 are used to calibrate PI P3 such that adjusting capacitance of C3 results in fine delay adjustment to the coarse delay selected from multiplexer 203.

Delay line 201 is also called coarse delay line. In one embodiment, delay line 201 generates clock edges at a resolution of propagation delay of buffers (d1-dn), in any given process node, and load capacitors C. In one embodiment, the finer edges (i.e., delays) which are smaller than a given delay of a buffer cell in any given process node are generated by the PI P3. In one embodiment, phase comparators 202 and 204 are used to ensure that the coarse delay line 201 is always locked to the given clock signal Clk. In one embodiment, phase comparator 204 ensures that the PIs P1, P2, and P3 span an entire coarse delay resolution.

In one embodiment, coarse delay line 201 is a series of back to back buffers with programmable capacitive loads C. In one embodiment, the same capacitive load is presented to all the buffers d1-dn to ensure uniform delay from one delay stage to another. In one embodiment, calibration unit 205 implements the logic to use phase comparators 202 and 204 and to ensure all the calibration routines are taken care of.

In one embodiment, calibration unit 205 first looks at the output of PC 202 and ensures that the last edge from delay cell do which is "nn" is phase aligned to the input clock "Clk." In one embodiment, this adjustment is done by uniformly varying the capacitance "C" seen by each buffer as shown in FIG. 2A. This process calibrates the Process, Temperature and Voltage (PVT) variations of the coarse delay cell. In one embodiment, once the calibration of the coarse delay line is complete the calibration routine is initiated for the PI and the routine ensures that "phase1" which is the output of PI P1 and "phase2" which is the output of PI P2 is aligned. In one embodiment, the control for adjusting the delays of the PI's are through current starving of the PI and the same current starving code is provided to PI P3 as shown by "out2" in FIG. 2A.

In one embodiment, PIs P1-P3 are current starved buffer cells with corresponding thermometer coded programmable capacitors C1-C3, respectively. In one embodiment, PIs P1 and P2 are used to calibrate the process, voltage, and temperature (PVT) variations of the cell (i.e., PIs). In one embodiment, calibration unit 205 provides PIs P1-P3 the same current starving code "out2." In one embodiment, capacitance of C2 is set to maximum capacitance loading while capacitance of C1 is set to minimum capacitance loading.

In one embodiment, the calibration unit 205 sets the loading of PI's P1 and P2 to the minimum and maximum capacitance value respectively. In one embodiment, PI P2 receives an earlier tap from the coarse delay line "n3" while the PI P1 receives a later edge/tap "n4." In one embodiment, since all the PI's are identical, when PI P2 is set to maximum capacitance loading and P1 is set to minimum capacitance loading and the calibration unit 205 ensures that the outputs "phase2" and "phase1" are aligned, then for the same current starving code for PI P3 every increment in capacitance value from the possible "minimum" to the "maximum" value results in edges between "n3" and "n4" which gives the fine granularity that is smaller than any standard cell.

In one embodiment, each increment value of the capacitance is equal for a given current starving code and PI size. In such an embodiment, each increment value of the capacitance determines the delay achievable and the resolution of the PWM pulse. In one embodiment, the smaller the capacitance, the finer the resolution. In such an embodiment, any resolution can be achieved by carefully designing the capacitance value and the size of the PIs.

In one embodiment, inputs to PIs P1 and P2 are chosen such that they are consecutive edges of the delay line 201. In one embodiment, the later edge of the delay line tap is coupled to the input of PI P1 with the minimum capacitance loading of C1 while the earlier tap is coupled to PI P2 with the maximum capacitance loading of C2. In such an embodiment, PI P3 with the same current drive capability of the other two PIs (P1 and P2) now spans the coarse delay cell with all of its capacitors. In such an embodiment, each capacitor (i.e., capacitor leg of capacitor C3) is now able to incrementally achieve a larger delay than the previous setting and thus achieve a fine resolution.

In one embodiment, capacitors C, C1, C2, and C3 are thermometer coded to ensure monotonic behavior for generating pulse width modulated signals. In one embodiment, each capacitor comprises a plurality of capacitor legs which are operable to couple in parallel to increase of decrease total capacitance of that capacitor. In one embodiment, the multiplexed output or coarse delay line 201 generates a phase shifted clock (i.e., coarse) which then eventually goes through the fine resolution PI P3 and finally a phase shifted clock ck_pwm_clk is generated which can be used to generate the PWM signal of FIG. 1.

In one embodiment, ck_pwm_clk signal can be generated at programmable phase shifts between 0-360 degrees of the input clock signal Clk. The embodiment of FIG. 3 uses delayed clocks to set and reset the final sequential unit (e.g., flip-flop) for PWM signal generation. In one embodiment, the clock signal propagating through delay line 201 and PI P3 is flushed out of the delay line/PI before using it to set and reset the final sequential unit i.e., every clock cycle resets the delay line before sending the clock signal again which is equivalent to clock gating the delay line before enabling the clock again.

Figure 2B:
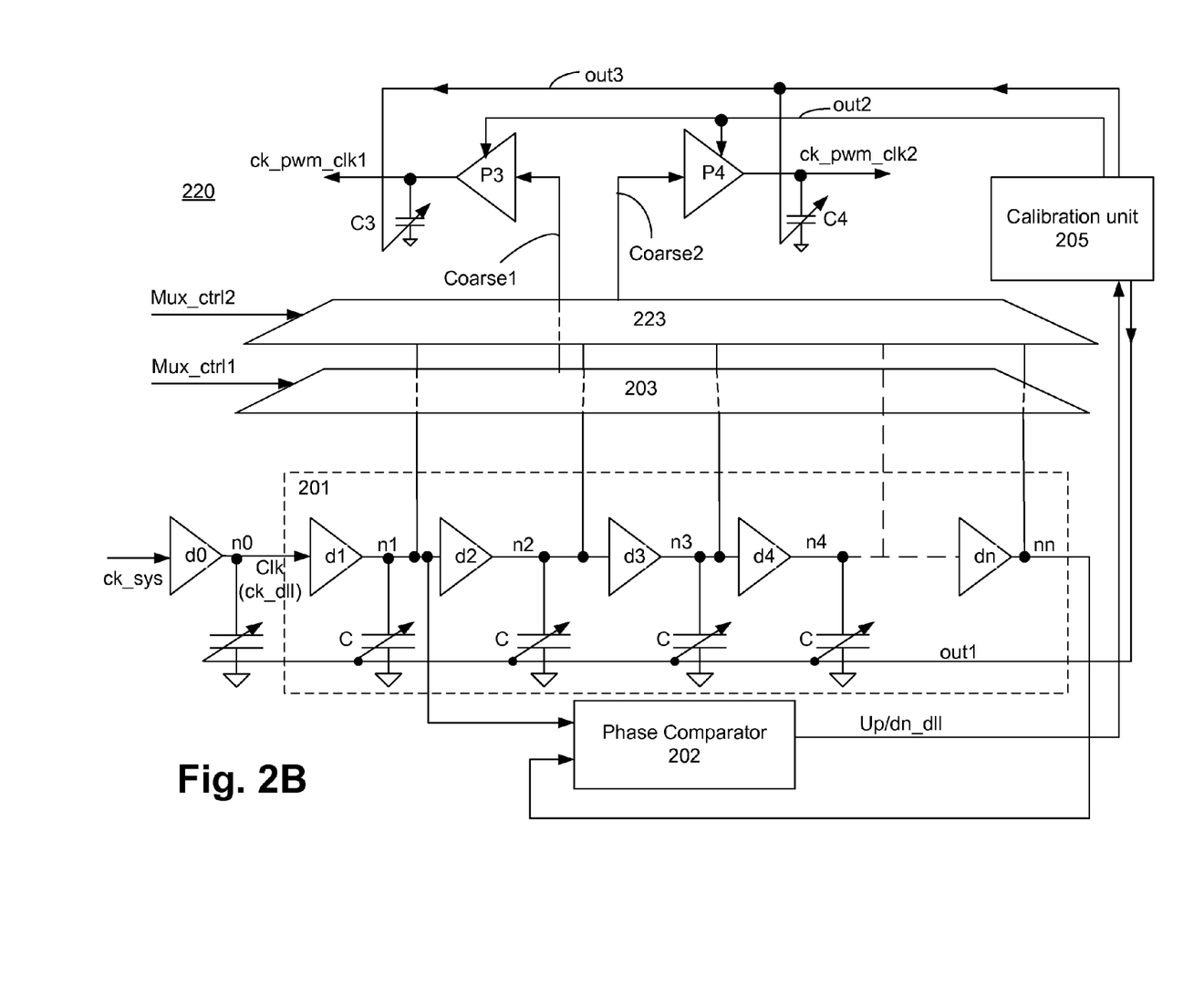
FIG. 2B is a circuit with a DLL and PIs for duty cycle adjustment of PWM signal using dual edge modulation, according to one embodiment of the disclosure.

FIG. 2B is a circuit 220 with a DLL and PIs for duty cycle adjustment of PWM signal using dual edge control, according to one embodiment of the disclosure. It is pointed out that those elements of FIG. 2B having the same reference numbers (or names) as the elements of any other figure can operate or function in any manner similar to that described, but are not limited to such. So as not to obscure the embodiment of 220, some elements of FIG. 2A are not shown and elements previously discussed are not discussed again in detail. For example, PIs P1 and P2, capacitors C1 and C2, phase comparator 204, etc., are not shown, but are deemed present.

While the embodiment of FIG. 2A is used for duty cycle modulation of a single edge of PWM signal, additional logic is added to FIG. 2B to perform duty cycle adjustment on an additional edge of PWM signal. For example, duty cycle modulation can be performed for both rising and falling edges of PWM signal. In such an embodiment, Vout can be more finely adjusted because duty cycle of the PWM signal can be adjusted using both edges (e.g., rising edge and falling edge) of PWM signal.

In one embodiment, multiplexer 223 is coupled in parallel to multiplexer 203. In such an embodiment, multiplexer 223 receives inputs which are coupled to taps (nodes n1-nn) of delay stages d1-dn of delay line 201. In one embodiment, multiplexer 223 is controlled by Mux_ctrl2 signal which selects the other edge of delayed signal i.e., other edge than the one selected by Mux_ctrl1 (same as Mux_ctrl of FIG. 2A) for multiplexer 203. In one embodiment, output of multiplexer 203 is Coarse1 signal which is the coarse clock and will be converted to the fine clock (i.e., ck_pwm_clk1) by PI P3. In one embodiment, output of multiplexer 223 is Coarse2 signal which is the coarse clock and will be converted to the fine clock (i.e., ck_pwm_clk2) by PI P4.

In one embodiment, Mux_ctrl2 signal is generated by controller 101. In this embodiment, additional PI P4 and corresponding adjustable capacitor C4 (same as C3) is used to generate ck_pwm_clk2 signal which is the second edge of selected delayed clock signal Clk. ck_pwm_clk of FIG. 2A is labeled as ck_pwm_clk1 in FIG. 2B. In one embodiment, PI P4 is also controlled by out2. In one embodiment, capacitor C4 is controlled by the same signal out3. In another embodiment, another signal from calibration unit 205 is used to control capacitor C4 independently of controlling capacitor C3.

Figure 3:
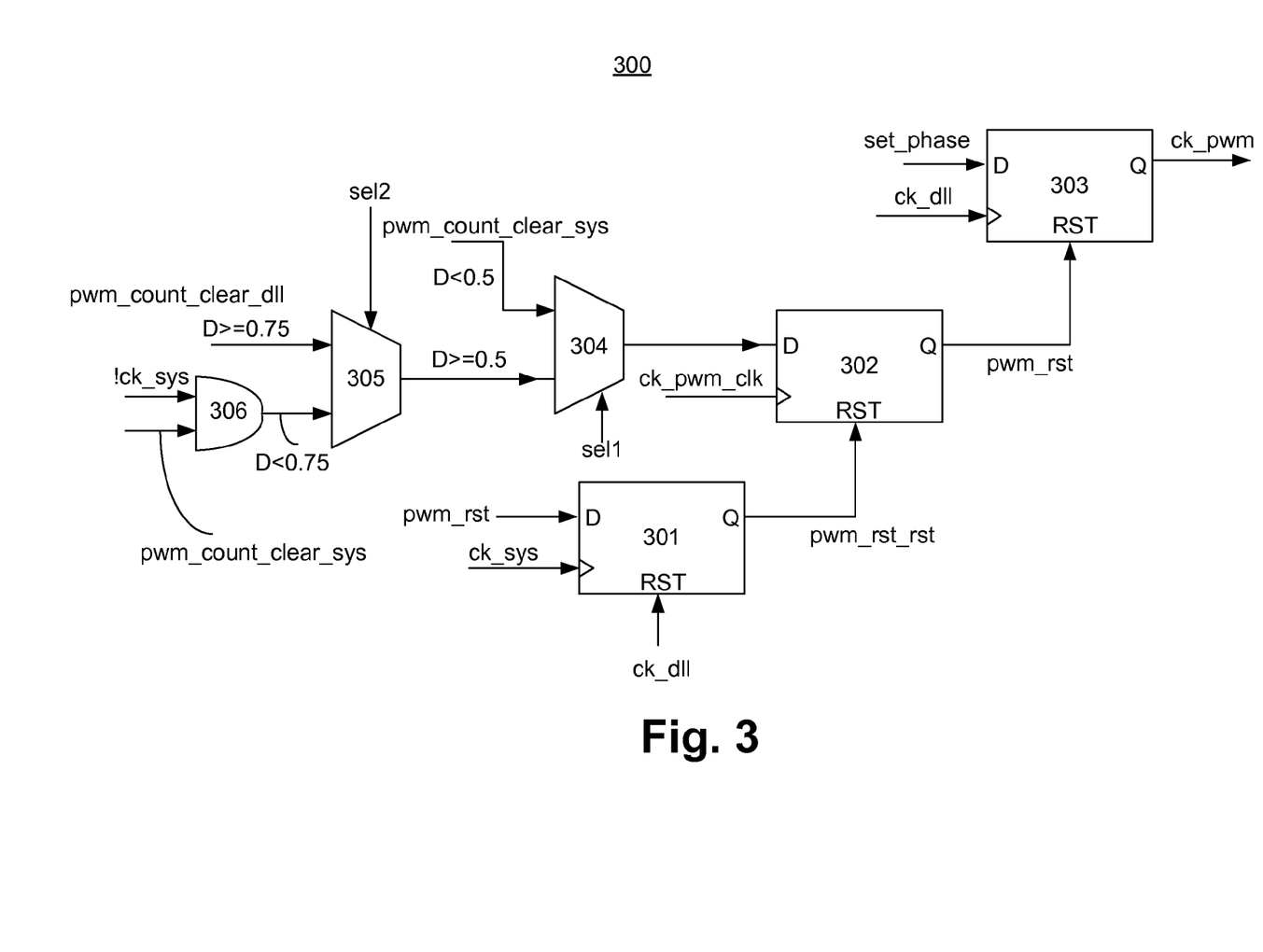
FIG. 3 is logic for generating digitally controlled PWM signal using output generated from FIG. 2A, according to one embodiment of the disclosure.

FIG. 3 is logic 300 (e.g., logic 103) for generating digitally controlled PWM signal using output generated from FIG. 2A, according to one embodiment of the disclosure. It is pointed out that those elements of FIG. 3 having the same reference numbers (or names) as the elements of any other figure can operate or function in any manner similar to that described, but are not limited to such.

In one embodiment, logic 300 comprises sequential units 301, 302, and 303, multiplexers 304 and 305, and logic gate 306. In one embodiment, sequential units 301, 302, and 303 are D-flops with an asynchronous active high reset (i.e., 1-reset, 0-Q follows D input). In other embodiments, other types of latches or flip-flops may be used. In one embodiment, sequential unit 301 receives a pwm_rst as input at its data terminal, ck_sys as clock signal, and outputs pwm_rst_rst to reset sequential unit 302. In one embodiment, sequential unit 302 receives output of multiplexer 304 as input at its data terminal, ck_pwm_clk (from PI P3) as clock signal, and generates an output pwm_rst to reset sequential unit 303. In one embodiment, sequential unit 303 receives set_phase signal as input at its data terminal, ck_dll as clock signal, and generates the PWM signal (also called ck_pwm).

In one embodiment, multiplexer 304 is operable to select via select signal sel1 to select one of outputs of multiplexer 305 or pwm_count_clear_sys signal. In one embodiment, multiplexer 305 is operable to select one of pwm_count_clear_dll or output of logic gate 306. In one embodiment, logic gate 306 is an AND gate. In other embodiments, logic gate 306 is a NAND gate. In one embodiment, logic gate 306 performs logical AND operation on pwm_count_clear_sys and !ck_sys signals. Here "!" indicates that the signal is being inverted. In one embodiment, signal pwm_count_clear_sys is generated at the rising edge of ck_sys in the ck_sys cycle in which the PWM falling edge occurs. In one embodiment, signal pwm_count_clear_dll is generated at the falling edge of the ck_dll in the ck_dll cycle in which the PWM falling edge occurs.

The duty cycle in a single edge modulation strategy (e.g., of FIG. 2A) requires only one duty cycle to be executed in a given switching period. In one embodiment, digital controller 101 knows the precise value that is required by the switching converter in the next switching cycle. Using this deterministic approach, in one embodiment, phase shifted clocks are generated using the coarse delay line and may be selected to generate the correct reset pulse to reset sequential units 301, 302, or 303 to avoid setup/hold violations.

In one embodiment, logic 300 has the following input clocks: ck_sys (same as Clk) is input system clock used for control logic and input to coarse DLL; ck_dll (also called ck_pwm_skew) is a delayed version of ck_sys with a constant phase shift (e.g., less than 25% of the clock period Clk); and ck_pwm_clk is output of PI P3.

In one embodiment, logic 300 sets rising edge of ck_pwm with a resolution of 1 clock cycle (Clk) from the coarse modulation logic (i.e., output "coarse" of multiplexer 203), and the falling edge of the ck_pwm with a resolution of ck_pwm_clk from P3 from the fine modulation logic (i.e., P3 and C3). In one embodiment, ck_pwm output gets set in the correct clock cycle when set_phase is 1 on the rising edge of ck_dll. In one embodiment, this feature can be used for leading edge modulation.

In one embodiment, falling edge of the ck_pwm is on the rising edge of pwm_rst which is controlled by ck_pwm_clk, thus providing trailing edge modulation if pwm_count_clear is 1. In one embodiment, pwm_rst flop 302 gets reset in the next clock cycle using the pwm_rst_rst signal which is high when ck_sys is 1 and ck_dll is 0. In order to ensure that the pwm_rst flop 302 does not have setup/hold violations, in one embodiment, the pwm_count_clear input is selected based on the following considerations based on the duty cycle.

In one embodiment, for D<0.5 (i.e., less than 50% duty cycle) as all signals with reference to ck_sys are not changing, pwm_count_clear_sys is used, where 'D' is duty cycle modulo the clock period. In one embodiment, for 0.5<D<0.75, all signals relative to ck_sys are not changing, and pwm_count_clear_sys is used but qualified with !ck_sys (where '!' indicates an inversion).

In one embodiment, pwm_count_clear_sys is qualified with !ck_sys in order to ensure that pwm_count_clear_sys which is generated at the beginning of the system clock cycle does not change at the beginning of the ck_dll clock cycle, when the ck_pwm_clk is also changing. In such an embodiment, setup/hold issues on flop 302 are avoided. In one embodiment, pwm_count_clear_sys can only change just after the falling edge of ck_sys, which is sufficiently before the ck_pwm_clock edge to avoid setup violations.

In one embodiment, for D>0.75, pwm_count_clear_dll does not change as it is generated from a flop clocked with the negative edge of ck_dll. In such an embodiment, pwm_count_clear_dll is used to ensure the 1st half of the ck_sys clock cycle does not cause pwm_rst to get set. Logic 300 ensures that the correct reset pulse is always chosen and the right duty cycle is generated from the DPWM module. In one embodiment, the select lines for multiplexers 304 and 305 are generated by combinatorial logic (not shown) that looks at the PWM command and decides if D<0.5, 0.5<D<0.75 or D>0.75.

Figure 4:
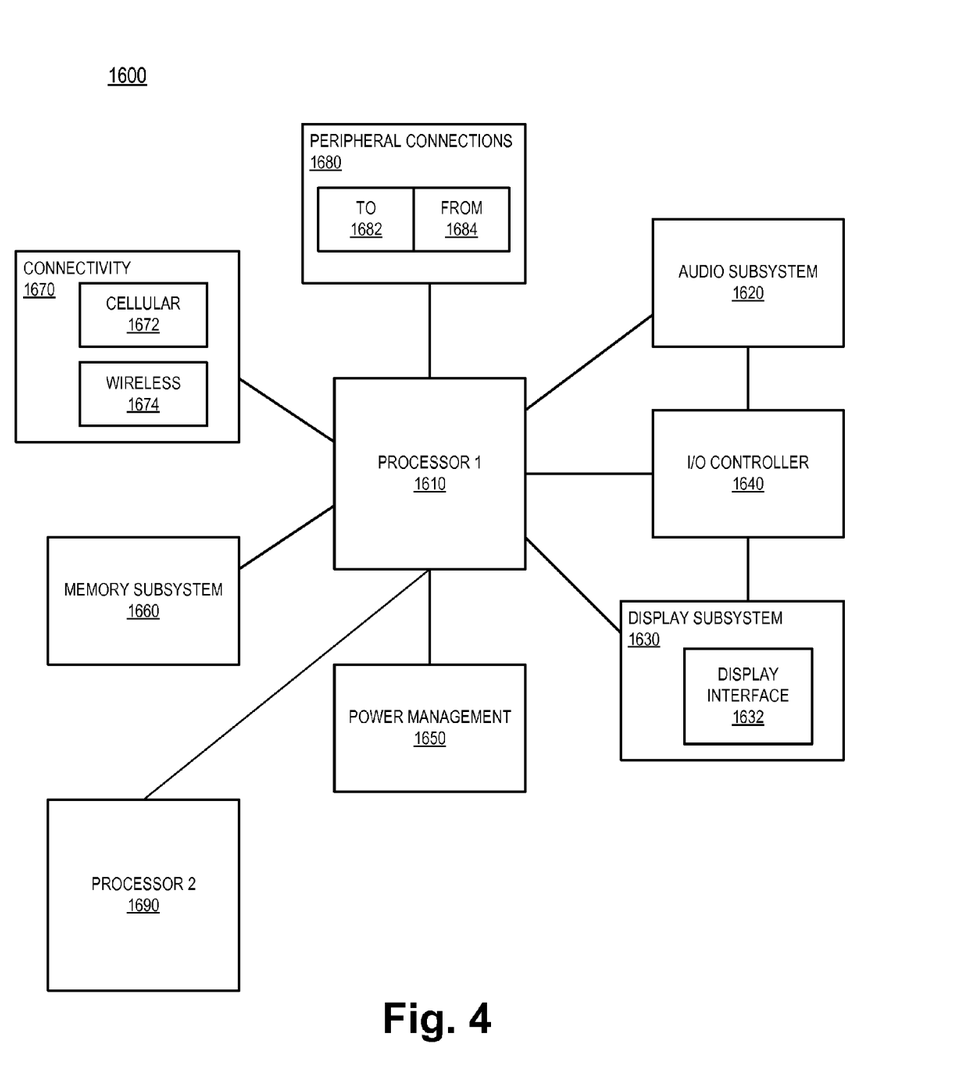
FIG. 4 is a smart device or a computer system or an SoC (system-on-chip) with apparatus for generating digitally controlled PWM signal, according to one embodiment of the disclosure.

FIG. 4 is a smart device or a computer system or an SoC (system-on-chip) with apparatus for generating digitally controlled pulse width modulation signal, according to one embodiment of the disclosure. It is pointed out that those elements of FIG. 4 having the same reference numbers (or names) as the elements of any other figure can operate or function in any manner similar to that described, but are not limited to such.

FIG. 4 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with digital pulse width modulator (and/or VR 100) described with reference to embodiments of FIGS. 1-3, according to the embodiments discussed. Other blocks of the computing device 1600 may also include digital pulse width modulator (and/or VR 100) described with reference to embodiments of FIGS. 1-3. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first phase interpolator (PI) for coupling an input to a delay element of a delay line, wherein the coupling is via a selection unit; a second PI for coupling an output of the delay element of the delay line, wherein the coupling is via the selection unit; and a third PI for providing an output, the third PI calibrated according to delay settings of the first and second PIs. In one embodiment, the first PI has an initial delay which is a maximum delay of the delay element.

In one embodiment, the second PI has an initial delay which is a minimum delay of the delay element. In one embodiment, the apparatus further comprises a calibration unit to phase align outputs of the first and second PIs. In one embodiment, the calibration unit is to calibrate delay of the third PI. In one embodiment, the apparatus further comprises a phase detector coupled to the first and second PIs for phase aligning outputs of the first and second PIs. In one embodiment, the output of phase detector is used by the calibration unit for phase aligning outputs of the first and second PIs by adjusting delay settings of the first and second PIs.

In one embodiment, each of the first, second, and third PIs comprise: a current controlled driver; and a thermometer coded programmable capacitor coupled to an output of the current controlled driver. In one embodiment, the apparatus further comprises a sequential unit that receives output of the third PI as clock and generates an output for generating a pulse width modulated signal. In one embodiment, the apparatus further comprises: a delay locked loop including the delay line with variable delay elements coupled together in series. In one embodiment, the apparatus further comprises: a digital controller for controlling the selection unit which is coupled to the delay line.

In another example, in one embodiment, a voltage regulator (VR) comprises: an inductor; a capacitor coupled to the inductor and a load; a bridge coupled to the inductor; and a pulse width modulator (PWM) for providing a pulse modulated signal to the bridge, the PWM comprising: a first phase interpolator (PI) for coupling an input to a delay element of a delay line via a selection unit; a second PI for coupling an output of the delay element of the delay line, via the selection unit; and a third PI for providing an output used for generating the pulse modulated signal, the third PI calibrated according to delay settings of the first and second PIs.

In one embodiment, the VR further comprises a set-reset (SR) latch for generating the pulse modulated signal according to the output of the third PI. In one embodiment, the SR latch to reset its output using output of the third PI, and wherein the SR latch to set its output to a known logical level using an output of a delay element from the delay line. In one embodiment, the load is a processor core.

In another example, in one embodiment, a system comprises: a memory unit; a processor, coupled to the memory unit, the processor including a voltage regulator, the voltage regulator having a pulse width modulator (PWM) comprising: a first phase interpolator (PI) for coupling an input to a delay element of a delay line via a selection unit; a second PI for coupling an output of the delay element of the delay line, via the selection unit; and a third PI for providing an output used for generating a pulse modulated signal, the third PI calibrated according to delay settings of the first and second PIs; and a wireless interface for allowing the processor to communicate with another device.

In one embodiment, the system further comprises a display unit for displaying content processed by the processor. In one embodiment, the display unit is a touch screen. In one embodiment, the PWM is according to apparatus described in the embodiments.

In another example, in one embodiment, a system comprises: a memory unit; and a processor, coupled to the memory unit, the processor including a voltage regulator comprising: a capacitor coupled to an inductor and a load; a bridge coupled to the inductor; and a pulse width modulator (PWM) for providing a pulse modulated signal to the bridge, the PWM comprising: a first phase interpolator (PI) for coupling an input to a delay element of a delay line via a selection unit; a second PI for coupling an output of the delay element of the delay line, via the selection unit; and a third PI for providing an output used for generating the pulse modulated signal, the third PI calibrated according to delay settings of the first and second PIs.

In one embodiment, the system further comprises: a wireless interface for allowing the processor to communicate with another device. In one embodiment, the system further comprises a display unit for displaying content processed by the processor. In one embodiment, the display unit is a touch screen. In one embodiment, the voltage regulator is according to VR described in various embodiments.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first phase interpolator (PI) for coupling an input to a delay element of a delay line, wherein the coupling is via a selection unit;
a second PI for coupling an output of the delay element of the delay line, wherein the coupling is via the selection unit; and
a third PI for providing an output, the third PI calibrated according to delay settings of the first and second PIs.

2. The apparatus of claim 1, wherein the first PI has an initial delay which is a maximum delay of the delay element.

3. The apparatus of claim 1, wherein the second PI has an initial delay which is a minimum delay of the delay element.

4. The apparatus of claim 1 further comprises a calibration unit to phase align outputs of the first and second PIs.

5. The apparatus of claim 4, wherein the calibration unit to calibrate delay of the third PI.

6. The apparatus of claim 4 further comprises a phase detector coupled to the first and second PIs for phase aligning outputs of the first and second PIs.

7. The apparatus of claim 6, wherein the output of phase detector is used by the calibration unit for phase aligning outputs of the first and second PIs by adjusting delay settings of the first and second PIs.

8. The apparatus of claim 1, wherein each of the first, second, and third PIs comprise:
a current controlled driver; and
a thermometer coded programmable capacitor coupled to an output of the current controlled driver.

9. The apparatus of claim 1 further comprises a sequential unit that receives output of the third PI as clock and generates an output for generating a pulse width modulated signal.

10. The apparatus of claim 1 further comprises:
a delay locked loop including the delay line with variable delay elements coupled together in series.

11. The apparatus of claim 1 further comprises:
a digital controller for controlling the selection unit which is coupled to the delay line.

12. A voltage regulator (VR) comprising:
an inductor;
a capacitor coupled to the inductor and a load;
a bridge coupled to the inductor; and
a pulse width modulator (PWM) for providing a pulse modulated signal to the bridge, the PWM comprising:
a first phase interpolator (PI) for coupling an input to a delay element of a delay line via a selection unit;
a second PI for coupling an output of the delay element of the delay line, via the selection unit; and
a third PI for providing an output used for generating the pulse modulated signal, the third PI calibrated according to delay settings of the first and second PIs.

13. The VR of claim 12 further comprises a set-reset (SR) latch for generating the pulse modulated signal according to the output of the third PI.

14. The VR of claim 13, wherein the SR latch to reset its output using output of the third PI, and wherein the SR latch to set its output to a known logical level using an output of a delay element from the delay line.

15. The VR of claim 12, wherein the load is a processor core.

16. A system comprising:
a memory unit;
a processor, coupled to the memory unit, the processor including a voltage regulator, the voltage regulator having a pulse width modulator (PWM) comprising:
a first phase interpolator (PI) for coupling an input to a delay element of a delay line via a selection unit;
a second PI for coupling an output of the delay element of the delay line, via the selection unit; and
a third PI for providing an output used for generating a pulse modulated signal, the third PI calibrated according to delay settings of the first and second PIs; and
a wireless interface for allowing the processor to communicate with another device.

17. The system of claim 16 further comprises a display unit for displaying content processed by the processor.

18. The system of claim 17, wherein the display unit is a touch screen.

19. The system of claim 18, wherein the first PI has an initial delay which is a maximum delay of the delay element.

20. The system of claim 18, wherein the second PI has an initial delay which is a minimum delay of the delay element.

* * * * *